United States Patent [19]

Hopkins

[11] Patent Number: 5,432,665
[45] Date of Patent: Jul. 11, 1995

[54] SHORT CIRCUIT PROTECTED CAPACITIVE LOAD DRIVER

[75] Inventor: Thomas L. R. Hopkins, Cary, Ill.

[73] Assignee: SGS-THOMSON Microelectronics, Inc., Carrollton, Tex.

[21] Appl. No.: 27,025

[22] Filed: Mar. 5, 1993

[51] Int. Cl.⁶ .............................................. H03K 5/00
[52] U.S. Cl. ....................................... 361/18; 361/91; 361/93
[58] Field of Search ...................... 361/18, 91, 93, 5, 6, 361/88, 92, 115; 307/540, 549, 571, 270, 254, 261

[56] References Cited

U.S. PATENT DOCUMENTS

| | | | |
|---|---|---|---|
| 4,329,600 | 5/1982 | Stewart | 307/540 |
| 5,051,609 | 9/1991 | Smith | 307/270 |

*Primary Examiner*—Brian K. Young
*Assistant Examiner*—S. Jackson
*Attorney, Agent, or Firm*—Rodney M. Anderson; Lisa K. Jorgenson; Richard K. Robinson

[57] ABSTRACT

A capacitive load driver is protected from short circuits to supply or to ground. The load driver includes an edge detecting monostable circuit and a plurality of sets of field effect transistor (FET) output devices, one set of the FET output devices having a low drain-to-source resistance and another set having a high drain-to-source resistance. The low resistance FET output devices provide a desired rise time voltage requirement on a capacitive load being driven. The high resistance FET output devices limit power dissipated under a short circuit to a predetermined amount.

10 Claims, 1 Drawing Sheet

SHORT CIRCUIT PROTECTED CAPACITIVE LOAD DRIVER

BACKGROUND OF THE INVENTION

1. Field of the Invention

The present invention relates to a capacitive load driver and, more particularly, to a capacitive load driver having short circuit protection.

2. Description of the Related Art

When driving capacitive loads (in, for example, printhead applications), there exists a possibility that a capacitive terminal could become shorted to either supply or to ground. It is thus desirable that a capacitive load driver withstand the short circuit. It is further desirable for a device having several driver outputs to remain operational when any of the outputs is shorted to either the supply or to ground.

Heretofore, driver outputs have been protected against short circuits by adding active current limiting characteristics to the driver. Another manner of short circuit protection includes depending on the $R_{DSon}$ (resistance of the drain to the source of a field effect transistor, or FET, when on) of the output or depending on the $B*I_b$ (current gain of the bipolar transistor multiplied by the base current) for a bipolar output to limit the current. Such techniques, however, are high dissipation techniques that may either cause a device with multiple outputs to overheat or activate the thermal protection feature on an integrated circuit. When many outputs are driven by one driver device, it is desirable to have the majority of the outputs active while a few of the outputs are protected. Accordingly, a low dissipation technique is desirable to provide adequate short circuit protection.

OBJECTS AND SUMMARY OF THE INVENTION

An object of the present invention is to provide a capacitive load driver which protects against short circuits using a low dissipation technique.

Another object of the present invention is to provide a capacitive load driver which does not degrade system performance.

A further object of the present invention is to provide a capacitive load driver that drives multiple capacitive loads.

The capacitive load driver of the present invention includes an edge detecting monostable circuit and a plurality of sets of FET output devices. One set of the FET output devices has a low $R_{DSon}$ that is calculated so that the rise time requirements of the voltage on the capacitive load can be achieved. Another set of FET output devices has a high $R_{DSon}$ so that the power dissipated under a short circuit does not exceed a predetermined amount, allowing the device to remain in operation without causing shutdown of the device.

BRIEF DESCRIPTION OF THE DRAWINGS

The invention will be described in detail with reference to the following figures wherein.

DETAILED DESCRIPTION OF PREFERRED EMBODIMENT

Figure 1:
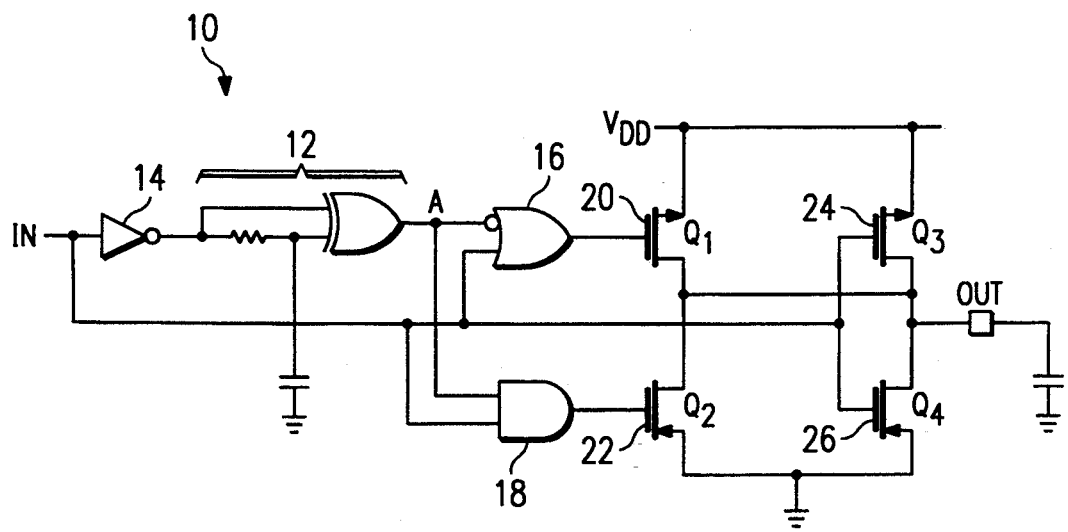
FIG. 1 is a circuit diagram of the capacitive load driver of the present invention.

Referring now to the drawings and more particularly to FIG. 1 thereof, the capacitive load driver 10 of the present invention is described.

The circuit receives an input signal and, using inverter 14, supplies an inverted input signal to an edge detecting monostable circuit 12. An output of the edge detecting monostable circuit 12 is supplied in inverted form to OR gate 16. The other input to OR gate 16 is provided from the input signal in noninverted form. An AND gate 18 receives inputs from the output of edge detecting monostable circuit 12 and from the noninverted input signal.

Two sets of FET output devices are provided in the circuit, one of the sets, FET output devices 20 and 22, having a low $R_{DSon}$. The other set of FET output devices 24 and 26 has a high $R_{DSon}$ which is higher than the low $R_{DSon}$ of FET output devices 20 and 22.

The output of OR gate 16 is supplied to the gate of FET output device 20. The output of AND gate 18 is supplied to the gate of FET output device 22. The sources of FET output devices 20 and 24 are connected to the supply voltage $V_{DD}$. The drain of FET output device 20 is connected to the drain of FET output device 22, and the drain of FET output device 24 is connected to the drain of FET output device 26. A connection further runs between the line connecting the drain of FET output device 20 to the drain of FET output device 22 and the line connecting the drain of FET output device 24 to the drain of FET output device 26. The noninverted input signal is connected to a line connecting the gates of FET output devices 24 and 26. The sources of FET output devices 22 and 26 are connected to each other, the connection line then being grounded.

An output signal of capacitive load driver 10 is provided at a line connecting the drain of FET output device 24 and the drain of FET output device 26.

Figure 2:
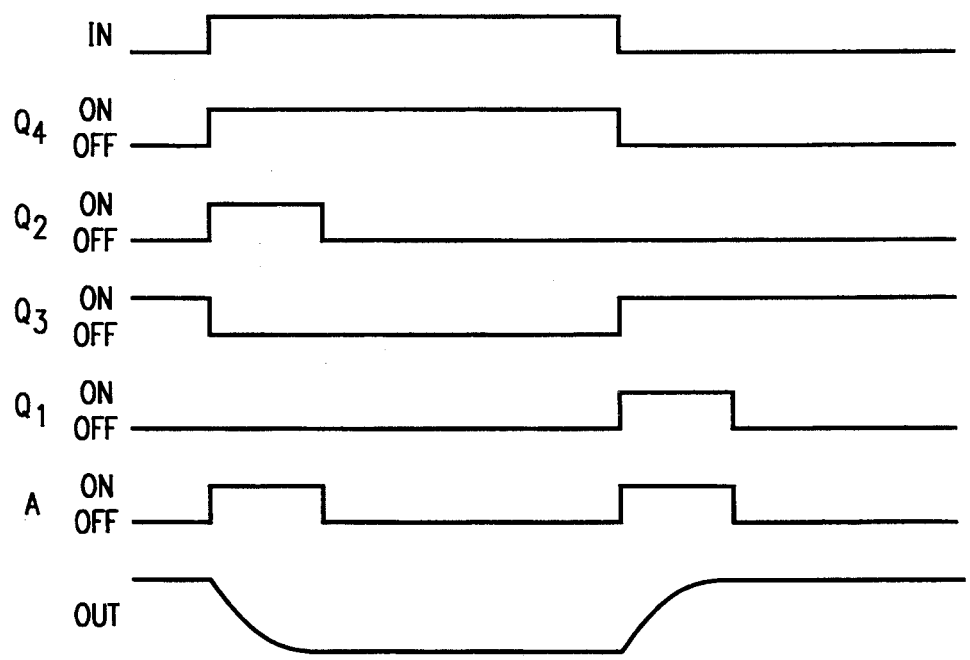
FIG. 2 illustrates timing diagrams of signals of the capacitive load driver.

FIG. 2 illustrates a timing diagram relating the states of the FET output devices 20, 22, 24 and 26 with the input signal, output signal and output of the edge detecting monostable circuit 12. In operation, when the input signal changes state from low to high, FET output devices 22 and 26 are turned on while FET output device 24 is turned off. The state of FET output device 20 does not change. FET output devices 22 and 26 remain on for a time that is determined by the edge detecting monostable circuit 12. The FET output device 22 is disabled at the end of the on time of edge detecting monostable circuit 12. The FET output device 26 is disabled when edge detecting monostable circuit 12 is again turned on.

The FET output device 24 remains disabled until the input signal changes state from high to low, at which time FET output devices 20 and 24 are both turned on. The FET output device 20 is then disabled at the end of the on time of edge detecting monostable circuit 12. The FET output device 24 remains on until the input signal changes state from low to high.

At the end of the on time of edge detecting monostable circuit 12, the high power dissipation resulting from current flowing through the FET output device 22 or 20 due to the short circuit on the capacitor terminal to the supply voltage or ground has a limited duty cycle. Accordingly, the average power dissipation is limited. The current flowing through FET output device 26 or 24 has a sufficiently low dissipation that it will not significantly heat the device 10. Thus, short circuit protection both for a short running from the output terminal to the supply $V_{DD}$ and for a short running from the output terminal to ground is provided without adversely affecting operation of the capacitive load driver 10.

If the period of the edge detecting monostable circuit 12 is selected to be longer than the rise time of the voltage on the capacitive load, then there is no degradation in system performance due to the higher resistance driving the capacitance. The output is self-protected against a short circuit to supply or to ground.

The capacitive load driver of the present invention provides short circuit protection while enabling several driver outputs to remain operational with one or several of the outputs shorted to either the supply or to ground.

While this invention has been described in conjunction with a specific embodiment thereof, it is evident that many alternatives, modifications and variations will be apparent to those skilled in the art. Accordingly, the preferred embodiments of the invention as set forth herein are intended to be illustrative, not limiting. Various changes may be made without departing from the spirit and scope of the invention as defined in the following claims.

What is claimed is:

1. A short circuit protected capacitive load driver, comprising:
    a first field effect output device, having a control electrode, and having a conduction path connected between a first supply voltage and an output node;
    a second field effect output device, having a control electrode driven by an input signal, and having a conduction path connected between the first supply voltage and the output node, said second field effect output device having a substantially larger on-resistance than said first field effect output device; and
    an edge detecting monostable circuit having an input for receiving the input signal, and having an output coupled to the control electrode of said first field effect output device, said edge detecting monostable circuit for turning on said first field effect output device, responsive to a transition of the input signal from a first logic state to a second logic state, for a selected amount of time, after which the edge detecting monostable circuit turns off the first field effect output device.

2. The capacitive load driver according to claim 1, further comprising:
    a third field effect output device, having a control electrode coupled to the output of the edge detecting monostable circuit, and having a conduction path coupled between the output node and a second supply voltage; and
    a fourth field effect output device, having a control electrode driven by the input signal and having a conduction path connected between the second supply voltage and the output node, said fourth field effect output device having a substantially larger on-resistance than said third field effect output device;
    wherein said edge detecting monostable circuit turns on said third field effect output device responsive to a transition of the input signal from the second logic state to the first logic state for a selected amount of time, after which the third circuit turns off the fourth field effect output device.

3. The capacitive load driver according to claim 2, wherein the on-resistance of said first and third field effect output devices provides a desired rise time voltage requirement on a capacitive load being driven.

4. The capacitive load driver according to claim 2, wherein a drain of said first field effect output device is connected to a drain of said third field effect output device at the output node;
    and wherein a drain of said second field effect output device is connected to a drain of said fourth field effect output devices at the output node.

5. The capacitive load driver according to claim 4, wherein a source of said first field effect output device and a source of said third field effect output device are both grounded.

6. A method of driving a capacitive load to provide short circuit protection, comprising the steps of:
    responsive to a transition of an input signal from a first logic state to a second logic state, turning on first and second transistors, each of the first and second transistors having a conduction path connected between a first voltage and the load, the first transistor having a substantially lower on-state resistance than the second transistor; and
    upon expiration of a selected time period after said turning on step, turning off the first transistor while maintaining the second transistor on.

7. The method of claim 6, further comprising:
    responsive to a transition of the input signal from the second logic state to a first logic state, turning on third and fourth transistors, each of the third and fourth transistors having a conduction path connected between a second voltage and the load, the third transistor having a substantially lower on-state resistance than the fourth transistor; and
    upon expiration of a selected time period after said step of turning on the third and fourth transistors, turning off the third transistor while maintaining the fourth transistor on.

8. The method of claim 7, wherein the selected time period is determined by the pulse width of an edge detecting monostable circuit.

9. The method of claim 7, wherein the first, second, third and fourth transistors are of the field effect type.

10. The method of claim 9, wherein the first and second transistors are of a first conductivity type;
    and wherein the third and fourth transistors are of a second conductivity type.

* * * * *

UNITED STATES PATENT AND TRADEMARK OFFICE
CERTIFICATE OF CORRECTION

PATENT  : 5,432,665

DATED  : July 11, 1995

INVENTOR(S) : Thomas L. R. Hopkins

It is certified that error appears in the above-identified patent and that said Letters Patent is hereby corrected as shown below:

The title page showing the illustrative figure should be deleted and substitute therefore the attached title page.

In the drawings, Sheet 1 of 1, Figure 1 should be deleted to be substitute with the corrected Figure 1, as shown on the attached page.

Signed and Sealed this

Seventh Day of October, 1997

Attest:

BRUCE LEHMAN

Attesting Officer

Commissioner of Patents and Trademarks

United States Patent [19]
Hopkins

[11] Patent Number: 5,432,665
[45] Date of Patent: Jul. 11, 1995

[54] SHORT CIRCUIT PROTECTED CAPACITIVE LOAD DRIVER

[75] Inventor: Thomas L. R. Hopkins, Cary, Ill.

[73] Assignee: SGS-THOMSON Microelectronics, Inc., Carrollton, Tex.

[21] Appl. No.: 27,025

[22] Filed: Mar. 5, 1993

[51] Int. Cl.⁶ .............................. H03K 5/00
[52] U.S. Cl. ......................... 361/18; 361/91; 361/93
[58] Field of Search ............ 361/18, 91, 93, 5, 6, 361/88, 92, 115; 307/540, 549, 571, 270, 254, 261

[56] References Cited
U.S. PATENT DOCUMENTS

| | | | |
|---|---|---|---|
| 4,329,600 | 5/1982 | Stewart | 307/540 |
| 5,051,609 | 9/1991 | Smith | 307/270 |

*Primary Examiner*—Brian K. Young
*Assistant Examiner*—S. Jackson
*Attorney, Agent, or Firm*—Rodney M. Anderson; Lisa K. Jorgenson; Richard K. Robinson

[57] ABSTRACT

A capacitive load driver is protected from short circuits to supply or to ground. The load driver includes an edge detecting monostable circuit and a plurality of sets of field effect transistor (FET) output devices, one set of the FET output devices having a low drain-to-source resistance and another set having a high drain-to-source resistance. The low resistance FET output devices provide a desired rise time voltage requirement on a capacitive load being driven. The high resistance FET output devices limit power dissipated under a short circuit to a predetermined amount.

10 Claims, 1 Drawing Sheet

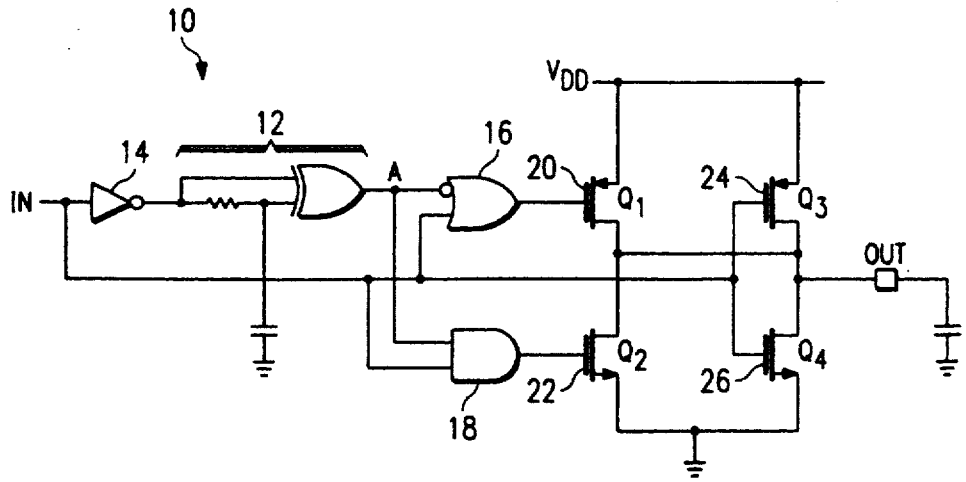

UNITED STATES PATENT AND TRADEMARK OFFICE
CERTIFICATE OF CORRECTION

PATENT NO. : 5,432,665
DATED : July 11, 1995
INVENTOR(S) : Thomas L. R. Hopkins

It is certified that error appears in the above-indentified patent and that said Letters Patent is hereby corrected as shown below:

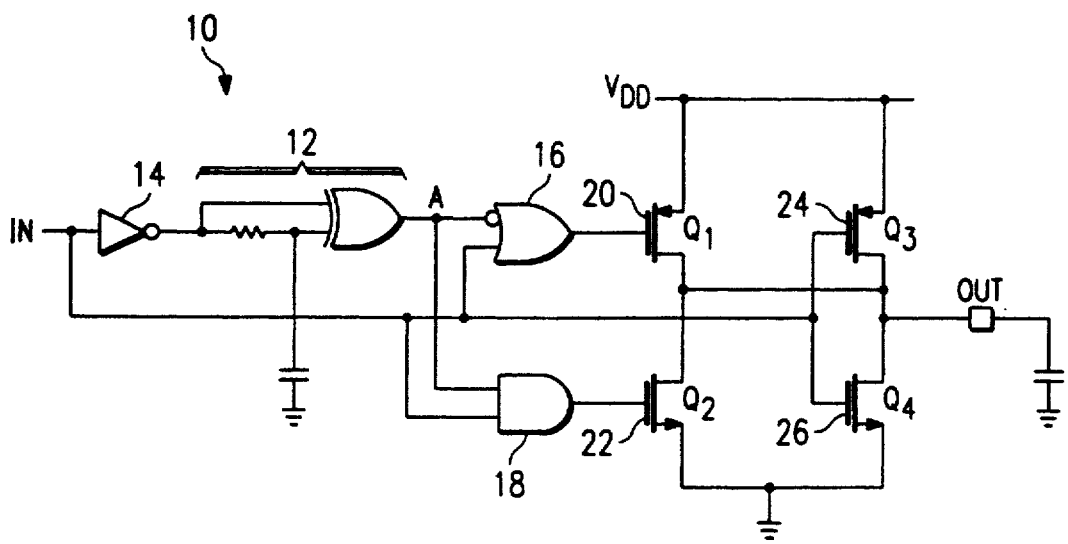

FIG. 1